United States Patent
Mongin et al.

(10) Patent No.: US 9,518,554 B2
(45) Date of Patent: Dec. 13, 2016

(54) RF POWER AMPLIFICATION AND DISTRIBUTION SYSTEMS, PLASMA IGNITION SYSTEMS, AND METHODS OF OPERATION THEREFOR

(71) Applicant: FREESCALE SEMICONDUCTOR, INC., Austin, TX (US)

(72) Inventors: Lionel Mongin, Fontenilles (FR); Mario M. Bokatius, Chandler, AZ (US); Pierre-Marie J. Piel, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 89 days.

(21) Appl. No.: 14/559,903

(22) Filed: Dec. 3, 2014

(65) Prior Publication Data

US 2015/0152833 A1 Jun. 4, 2015

(30) Foreign Application Priority Data

Dec. 4, 2013 (EP) ..................................... 13306666

(51) Int. Cl.
*F02P 23/04* (2006.01)
*F02P 9/00* (2006.01)
(Continued)

(52) U.S. Cl.
CPC .................. *F02P 9/007* (2013.01); *F02P 7/02* (2013.01); *F02P 15/08* (2013.01); *F02P 23/045* (2013.01);
(Continued)

(58) Field of Classification Search
CPC ............. F02P 9/007; F02P 7/02; F02P 23/045; F02P 15/08; H03G 3/3042; H03F 1/0288; H03F 3/24; H03F 3/195; H03F 3/211; H03F 2200/405; H03F 2203/21106; H03F 2203/21142
(Continued)

(56) References Cited

U.S. PATENT DOCUMENTS

| 3,934,566 A | 1/1976 | Ward |
| 7,542,740 B1 | 6/2009 | Granger-Jones |

(Continued)

FOREIGN PATENT DOCUMENTS

| EP | 2592911 A1 | 5/2013 |
| EP | 2621085 A2 | 7/2013 |

(Continued)

OTHER PUBLICATIONS

EP Application No. 13306666.2, Extended European Search Report, mailed Oct. 14, 2014.

*Primary Examiner* — Hai Huynh
(74) *Attorney, Agent, or Firm* — Sherry W. Schumm

(57) ABSTRACT

An embodiment of a plasma ignition system for an internal combustion engine having up to N cylinders includes a power splitter, N phase shifters, N amplifiers, a power combiner network, and up to N radiation devices. The power splitter divides an input RF signal into N divided RF signals. Each phase shifter applies one of multiple pre-determined phase shifts to one of the N divided RF signals to produce N phase shifted RF signals. The N amplifiers amplify the N phase shifted RF signals to produce N amplified, phase shifted RF signals. The power combiner network combines the N amplified, phase shifted RF signals to produce N output RF signals. Each of the radiation devices receives one of the N output RF signals, and produces a plasma discharge when a power level of the output RF signal is sufficiently high.

18 Claims, 4 Drawing Sheets

(51) Int. Cl.
*F02P 15/08* (2006.01)
*H03F 3/21* (2006.01)
*F02P 7/02* (2006.01)
*H03F 1/02* (2006.01)
*H03F 3/195* (2006.01)
*H03F 3/24* (2006.01)
*H03G 3/30* (2006.01)

(52) U.S. Cl.
CPC ............ *H03F 1/0288* (2013.01); *H03F 3/195* (2013.01); *H03F 3/211* (2013.01); *H03F 3/24* (2013.01); *H03G 3/3042* (2013.01); *H03F 2200/405* (2013.01); *H03F 2203/21106* (2013.01); *H03F 2203/21142* (2013.01)

(58) Field of Classification Search
USPC . 123/618, 619, 623; 324/380, 381; 361/253, 254; 327/355
See application file for complete search history.

(56) References Cited

U.S. PATENT DOCUMENTS

| | | | |
|---|---|---|---|
| 8,514,007 B1 | 8/2013 | Ahmed et al. | |
| 8,736,347 B2* | 5/2014 | Ahmed | G06G 7/10 327/355 |
| 8,873,216 B2* | 10/2014 | Ikeda | F02P 3/01 361/247 |
| 8,948,306 B2* | 2/2015 | Borodulin | H03F 3/19 330/124 R |
| 9,030,252 B2* | 5/2015 | Makita | H01P 5/16 327/374 |
| 2014/0184302 A1 | 7/2014 | Makita et al. | |
| 2016/0049727 A1* | 2/2016 | Kroening | H01Q 3/36 342/373 |

FOREIGN PATENT DOCUMENTS

| | | |
|---|---|---|
| WO | 03042533 A1 | 5/2003 |
| WO | 2012161228 A1 | 11/2012 |

* cited by examiner

RF POWER AMPLIFICATION AND DISTRIBUTION SYSTEMS, PLASMA IGNITION SYSTEMS, AND METHODS OF OPERATION THEREFOR

TECHNICAL FIELD

Embodiments of the subject matter described herein relate generally to radio frequency (RF) power distribution systems, and more particularly to plasma ignition systems that include RF power distribution systems for delivering RF power to multiple cylinders of an internal combustion engine.

BACKGROUND

A typical internal combustion engine for a motor vehicle includes multiple cylinders, their associated pistons, a crankshaft, a fuel delivery and exhaust system (including a camshaft and associated valves), and an ignition system, the combination of which makes up the primary torque generation subsystem for the vehicle. When a piston is properly engaged within a cylinder, a combustion chamber is defined by the top of the piston, the cylinder sidewalls, and a cylinder head sitting atop the cylinder. During operation of the engine, the volume of the combustion chamber is varied by moving the piston linearly within the cylinder. It is the variation in the combustion chamber volume which, ultimately, may be translated into torque for propelling the vehicle.

More specifically, in both a two-stroke and a four-stroke engine, the volume of the combustion chamber is decreased and increased, respectively, during a compression stroke and a power stroke of the piston. Prior to the compression stroke (i.e., during an intake stroke), rotation of the camshaft causes a fuel intake valve to open, which allows atomized fuel to be injected into the chamber to produce a fuel/air mixture within the chamber. During the compression stroke, the piston is pushed toward the cylinder head (or toward a "top dead center" position), which compresses the fuel/air mixture, thus increasing the mixture's thermal energy. At or near the time that the piston reaches the top dead center position, a sparkplug produces a spark within the combustion chamber. The spark ignites the compressed fuel/air mixture, causing it to combust and expand with explosive force. The force of expansion initiates the piston's power stroke, during which the exploding fuel forces the piston rapidly away from the cylinder head. During a subsequent exhaust stroke, the camshaft rotation causes an exhaust valve to open, thus allowing the gasses within the combustion chamber (e.g., the exhaust gasses) to exit the cylinder.

Each piston has a connecting rod coupled to the crankshaft, and during the power stroke, the connecting rod exerts a strong linear force on the crankshaft, which converts the linear force into a rotational force. In order to maintain the crankshaft rotation, the combustions within the multiple chambers are timed so that the linear forces exerted on the crankshaft by each piston are out of phase with each other. More specifically, a distributor of the ignition system is used to route high voltage from an ignition coil to each sparkplug in a carefully timed and correct firing order. The torque associated with the crankshaft's rotational force ultimately can be translated into axle and wheel rotation, thus enabling propulsion of the vehicle.

In practice, the above-described combustion process is not 100% efficient. For example, during each combustion cycle, a certain amount of unburned fuel remains in the combustion chamber after each power stroke, and the unburned fuel is exhausted to the atmosphere during the exhaust stroke. The quantity of fuel that remains unburned during a combustion cycle affects the vehicle's fuel efficiency. Thus, engine developers seek to improve ignition systems to increase the percentage of fuel within each chamber that is burned during each combustion cycle.

In addition, combustion of the fuel/air mixture results in the production of a variety of gasses, which are exhausted from the vehicle through the vehicle's exhaust system. For example, in a typical petroleum-fueled engine, exhaust gasses include nitrogen oxides ($NO_x$), carbon dioxide ($CO_2$), and carbon monoxide (CO), among other things. Some of the exhaust gasses may be harmful to humans and to the environment when they are present in sufficient quantities. Accordingly, engine developers also seek to modify fuels and ignition systems in order to reduce the quantity of potentially-harmful gasses that are exhausted into the environment.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the inventive subject matter include plasma ignition systems, associated RF power amplification and distribution systems, and methods of their operation. As will be explained in more detail below, such systems and methods may result in significant increases in fuel efficiency and reductions in the quantities of potentially-harmful gasses that are exhausted into the environment, when compared with conventional internal combustion engines that utilize ignition coils and sparkplugs. Similar to an ignition system of a conventional internal combustion engine, a plasma ignition system functions to combust gaseous fuel in combustion chamber defined by a piston and cylinder arrangement. However, in a plasma ignition system, the combustion is achieved by discharging high energy plasma into the combustion chamber, rather than producing a relatively low energy spark within the combustion chamber. The high energy plasma discharge burns fuel more efficiently than would a spark. In addition, the plasma discharge may be produced in a combustion chamber having significantly higher pressures than would be possible for a conventional spark. Accordingly, a plasma ignition system may enable higher power operation than a conventional ignition system.

Figure 1:
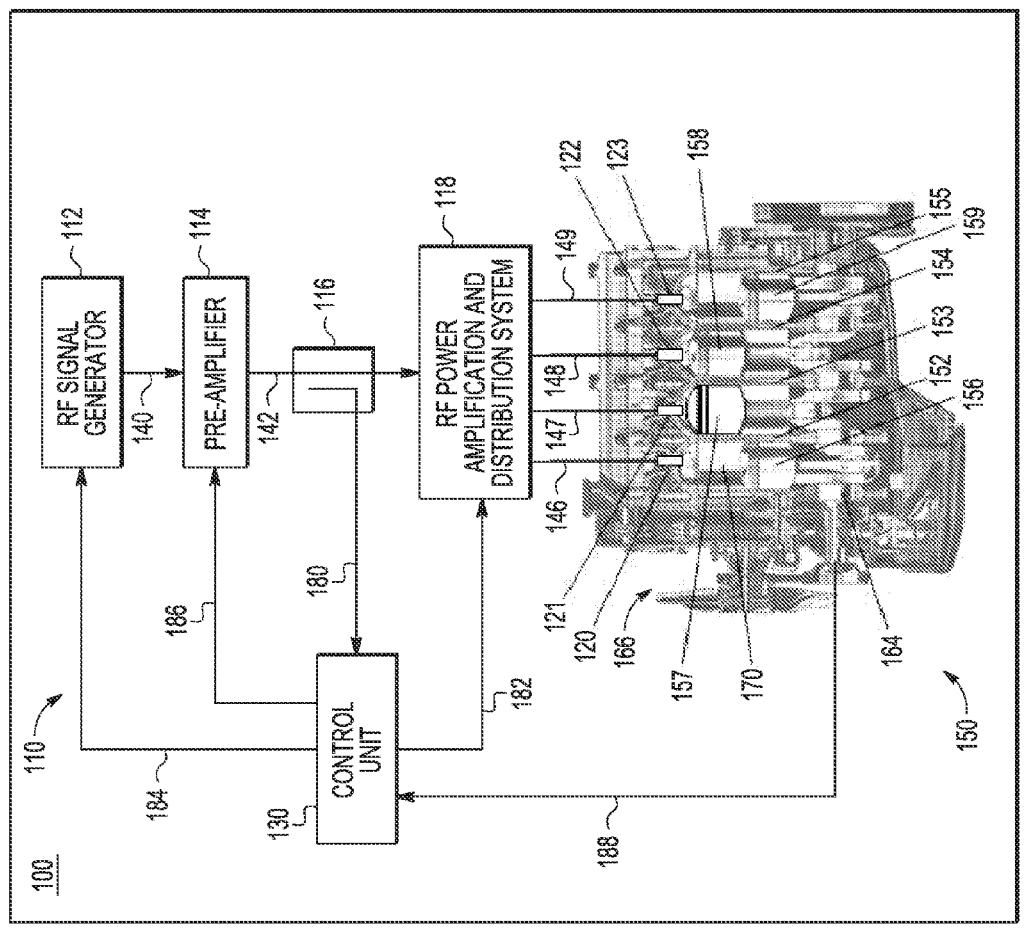
FIG. 1 is a simplified block diagram of a plasma ignition system for a four cylinder engine, in accordance with an example embodiment.

FIG. 1 is a simplified block diagram of a torque generation system 100 that includes a plasma ignition system 110 and an internal combustion engine 150, in accordance with an example embodiment. For example, the torque generation system 100 may be incorporated into a motor vehicle, and the torque generation system 100 may function as the primary source of torque used to propel the vehicle.

Internal combustion engine 150 is similar to a conventional internal combustion engine, in that engine 150 includes multiple cylinders 152-155, their associated pistons 156-159 and connecting rods 160-163, a crankshaft 164, and a fuel delivery and exhaust system 166 that includes a camshaft (not numbered) configured to operate fuel intake and exhaust valves (not numbered). As with a conventional internal combustion engine, a chamber 170 is defined by each piston/cylinder pair in internal combustion engine 150, and the volume of the chamber 170 is decreased and increased, respectively, during a compression stroke and a power stroke of the piston. In contrast with a conventional internal combustion engine, however, in the internal combustion engine 150 of FIG. 1, a radiation device 120-123 of the plasma ignition system 110 produces a high energy plasma discharge in the chamber 170 at or near the time that the piston reaches the top dead center position (e.g., the position of piston 157 in cylinder 153). The plasma discharge ignites a compressed fuel/air mixture within the chamber 170, causing the fuel to combust and expand with explosive force. The force of expansion initiates the piston's power stroke, during which the exploding fuel forces the piston 156-159 rapidly away from the cylinder head. The piston's connecting rod 160-163 exerts a strong linear force on the crankshaft 164, which converts the linear force into a rotational force or torque. The torque associated with the crankshaft's rotational force ultimately can be translated into axle and wheel rotation, thus enabling propulsion of a vehicle within which system 100 is incorporated.

Also similar to operation of a conventional internal combustion engine, in order to maintain the rotation of crankshaft 164, the combustions within the multiple chambers 170 of internal combustion engine 150 are timed so that the linear forces exerted on the crankshaft 164 by each piston 156-159 and connecting rod 160-163 are out of phase with each other (e.g., about 90 degrees out of phase with each other in a four-cylinder, four-stroke engine).

Plasma ignition system 110 is configured to provide high power RF energy to each radiation device 120-123 in order to produce a plasma discharge in each chamber 170. More specifically, plasma ignition system 110 is configured so that the high power RF energy provided to the radiation devices 120-123 is timed to achieve out of phase, timed plasma discharges within the chambers 170, and thus to cause continuous crankshaft rotation. To produce the timed plasma discharges, plasma ignition system 110 includes RF signal generator 112, pre-amplifier 114, RF power amplification and distribution system 118, and radiation devices 120-123. In addition, as will be discussed later, plasma ignition system 110 also includes directional coupler 116 and control unit 130.

RF signal generator 112 is configured to produce an RF signal 140. For example, the RF signal 140 may include periodic pulses of RF power, where each pulse is produced at or near the beginning of a power stroke for each cylinder 152-155. The duration of each pulse may be shorter than the duration of each power stroke. For example, the duration of each pulse may be from about 10 percent to about 50 percent of the duration of each power stroke, and each pulse may be timed to arrive at a cylinder at a beginning of each power stroke. The RF power in RF signal 140 may be produced at a frequency in a range of about 1.0 megahertz (MHz) to about 6.0 gigahertz (GHz) (e.g., about 2.4 GHz) according to various embodiments. In other embodiments, the frequency of the RF power may be higher or lower than the above given range.

The output of RF signal generator 112 is coupled to the input of pre-amplifier 114. Pre-amplifier 114 may be a single stage amplifier or a multiple-stage amplifier, in various embodiments. Essentially, pre-amplifier 114 receives and amplifies the RF signal 140 produced by RF signal generator 112, in order to produce an amplified RF signal 142 having a power level that is sufficient to enable generation of a plasma discharge by radiation devices 120-123. For example, the RF signal 140 produced by RF signal generator 112 may have a power level in the milliwatt (mW) range, and pre-amplifier 114 may amplify the RF signal 140 to produce an output RF signal 142. For example, depending upon the amount of gain applied by pre-amplifier 114, pre-amplifier 114 may produce an RF signal 142 having a power level from the mW range (e.g., as low as 1.0 mW) up to a power level of hundreds or thousands of watts (W) (e.g., up to or exceeding about 2.0 kilowatts (kW)), in an embodiment. In alternate embodiments, the power levels of the RF signals 140, 142 produced by the RF signal generator 112 and/or the pre-amplifier 114 may be higher or lower than the above given ranges. In an alternate embodiment, pre-amplifier 114 may be excluded from the plasma ignition system 110.

In an embodiment that includes pre-amplifier 114, the output of pre-amplifier 114 is coupled to the input of RF power amplification and distribution system 118. Alternatively, in an embodiment that does not include pre-amplifier 114, the output of RF signal generator 112 is coupled to the input of RF power amplification and distribution system 118. Either way, RF power amplification and distribution system 118 is configured to receive an RF signal (either RF signal 140 or 142) produced by RF signal generator 112 or pre-amplifier 114, and to distribute the RF signal to the radiation devices 120-123 associated with the various piston/cylinder pairs. More specifically, RF power amplification and distribution system 118 is configured to provide multiple pulsed RF signals 146-149 to the radiation devices 120-123. According to an embodiment, the RF power amplification and distribution system 118 produces a pulsed RF signal 146-149 to each radiation device 120-123 at or near the time when a piston 156-159 that is coupled to the same cylinder 152-155 as the radiation device 120-123 is at or near top dead center (i.e., at or near the beginning of the power stroke). According to a further embodiment, only one RF signal 146-149 of significant power is provided at any given time by the RF power amplification and distribution system 118 to the radiation devices 120-123.

Figure 2:
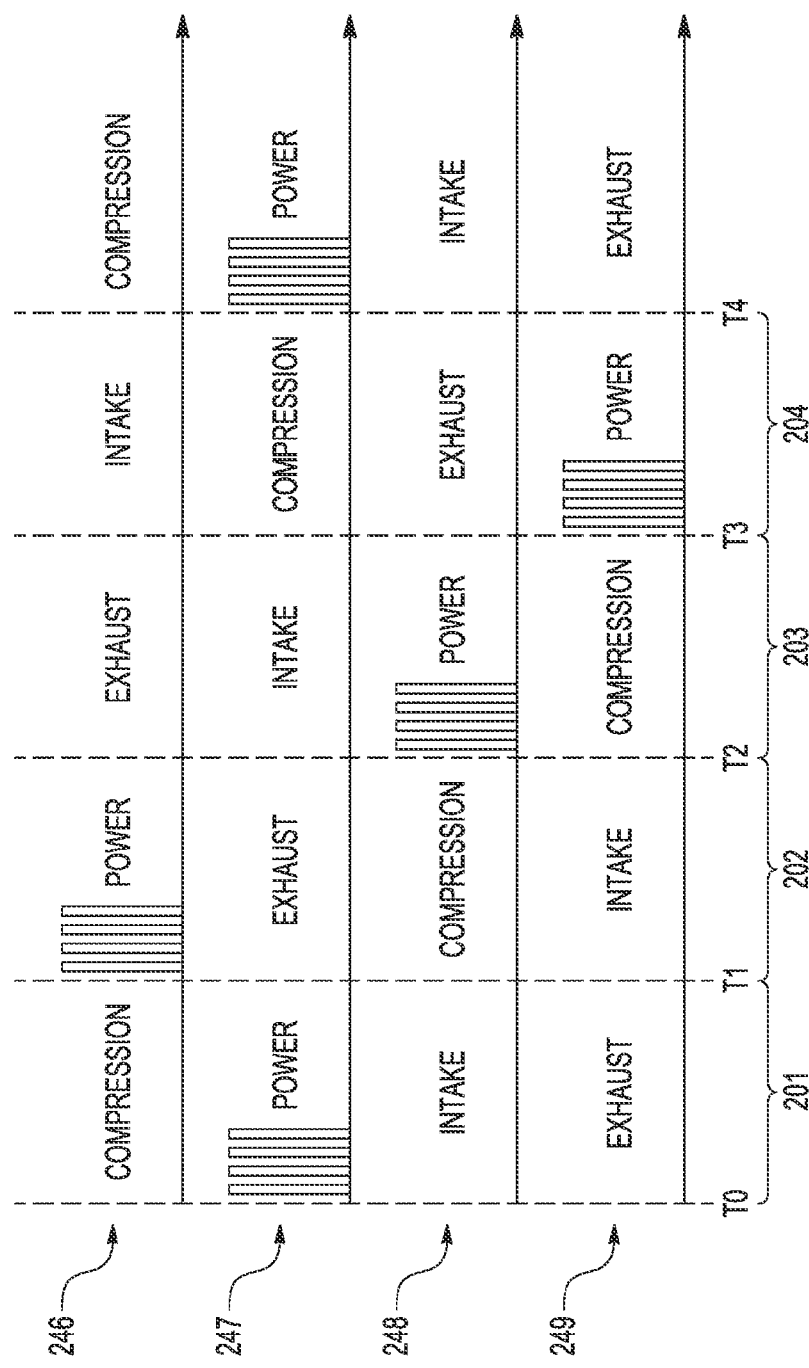
FIG. 2 is a timing diagram illustrating the timing of distributed RF power signals for a four cylinder engine, in accordance with an example embodiment.

For example, FIG. 2 is a timing diagram illustrating example timing of distributed RF signals 202, 204, 206, 208 for a four cylinder engine (e.g., engine 150, FIG. 1), in accordance with an example embodiment. For example, each of the distributed RF signals 202, 204, 206, 208 may be produced by RF power amplification and distribution system 118 and provided to one of the radiation devices 120-123. More specifically, FIG. 2 illustrates a first pulsed RF signal 246 that may be supplied to a first radiation element (e.g., signal 146 supplied to radiation element 120), a second pulsed RF signal 247 that may be supplied to a second radiation element (e.g., signal 147 supplied to radiation element 121), a third pulsed RF signal 248 that may be supplied to a third radiation element (e.g., signal 148 supplied to radiation element 122), and a fourth pulsed RF signal 249 that may be supplied to a fourth radiation element (e.g., signal 149 supplied to radiation element 123).

As mentioned previously, various ones of the embodiments may be illustrated in a four stroke, four cylinder engine (e.g., engine 150). Accordingly, for each cylinder 152-155, each time period 201-204 corresponds to one of the four strokes in a four stroke cycle (e.g., one of the intake, compression, power, and exhaust strokes). For example, as indicated in FIG. 2, during time period 201, cylinder 152 performs a compression stroke, cylinder 153 performs a power stroke, cylinder 154 performs an intake stroke, and cylinder 155 performs an exhaust stroke. Also during time period 201, a pulsed RF signal 247 is supplied to the radiation element 121 associated with cylinder 153. The pulsed RF signal 247 causes radiation element 121 to produce a plasma discharge in the combustion chamber of cylinder 153, thus igniting the compressed fuel within the combustion chamber and producing the power stroke for cylinder 153. Similarly, during subsequent time periods 202, 203, 204, pulsed RF signals 246, 248, 249 are supplied, respectively, to the radiation devices 120, 122, and 123 associated with cylinders 152, 154, and 155. The four stroke cycle then repeats for each of the cylinders 152-155.

Referring again to FIG. 1, directional coupler 116 is configured to detect the forward and reflected power of the RF signal provided to RF power amplification and distribution system 118 (e.g., RF signal 140 or 142), and to produce signals 180 indicating the detected forward and reflected power levels. According to an embodiment in which closed-loop control is implemented, control unit 130 receives the power level signals 180, and based on the signals 180, provides control signals 182 to RF power amplification and distribution system 118. As will be described in more detail below, the control signals 182 affect the timing and/or attenuation of the pulsed RF signals 146-149 (e.g., pulsed RF signals 246-249) that are provided to the radiation devices 120-123. In an alternate embodiment, the plasma ignition system 110 may operate open loop, and control unit 130 may not receive the power level signals 180 from directional coupler 116 (e.g., directional coupler 116 may be excluded from the system 110). In such an embodiment, control unit 130 instead may receive a trigger input (e.g., via a feedback signal 188 from crankshaft 164), which indicates to control unit 130 the correct timing of the pulsed RF signals 146-149 that are to be provided by the RF power amplification and distribution system 118 to the radiation devices 120-123, and control unit 130 may provide control signals 182 RF power amplification and distribution system 118 accordingly. According to an embodiment, control unit 130 also may provide signals 184, 186 to the RF signal generator 112 and/or the pre-amplifier 114, which causes the RF signal generator 112 and/or the pre-amplifier 114 to increase or decrease the magnitude of the RF signal 140 and/or the amplified RF signal 142.

As indicated above, control unit 130 also may receive one or more feedback signals 188 from engine 150 indicating the angular position of the crankshaft 164. This information indicates the position of each piston 156-159 within each cylinder 152-155, and thus the state within the four stroke cycle for each cylinder 152-155. Control unit 130 may use the feedback signal to control the timing of the intake and exhaust valves (e.g., by controlling the angular rotation of the camshaft).

As discussed above, RF power amplification and distribution system 118 is configured to receive an RF signal (e.g., RF signal 140 or 142), and to distribute the amplified RF signal to the radiation devices 120-123 associated with the various piston/cylinder pairs (i.e., to provide multiple pulsed RF signals 146-149 to the radiation devices 120-123). According to various embodiments, the RF power amplification and distribution system 118 is implemented with a combination of one or more power splitters, a plurality of phase shifters, a plurality of amplifiers, and a network of power combiners which together produce a plurality of pulsed RF signals (e.g., pulsed RF signals 246-249, FIG. 2) that are provided to the radiation devices 120-123 associated with the cylinders 152-155 in a timed manner. In addition, as will be described in more detail below, embodiments of the RF power amplification and distribution system 118 may include multiple attenuators that can be controlled to affect the amplitudes of the pulsed RF signals.

Figure 3:
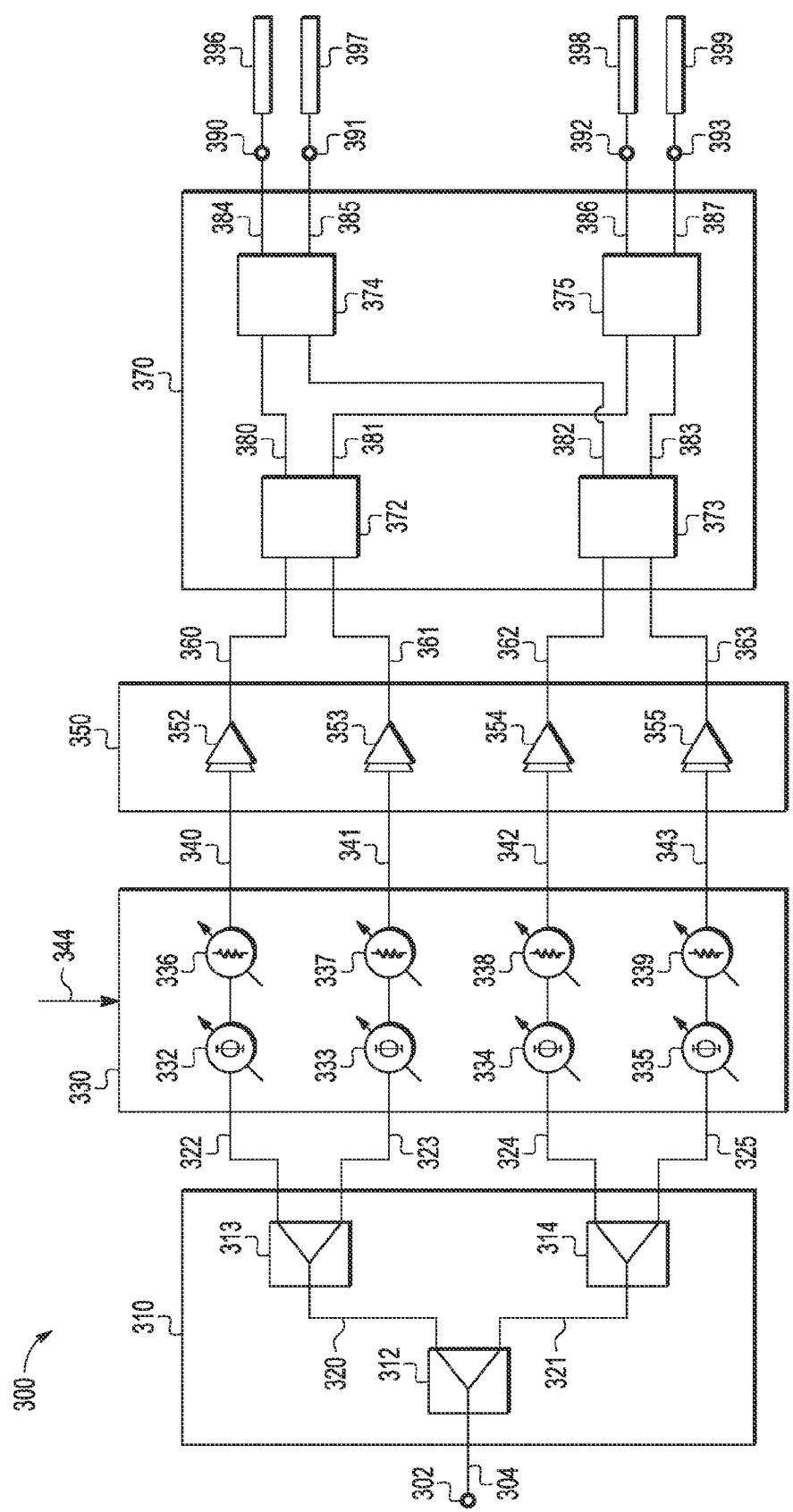
FIG. 3 is a schematic diagram of an RF power amplification and distribution system, in accordance with an example embodiment.

FIG. 3 is a schematic diagram of an RF power amplification and distribution system 300 (e.g., RF power amplification and distribution system 118, FIG. 1), in accordance with an example embodiment. RF power amplification and distribution system 300 includes an input port 302, a power splitter 310, a plurality of variable phase shifters 332, 333, 334, 335, a plurality of amplifiers 352, 353, 354, 355, a power combiner network 370, and a plurality of output ports 390, 391, 392, 393. Each output port is coupled to a radiation device 396, 397, 398, 399 (e.g., radiation devices 120-123, FIG. 1) that is configured to generate a plasma discharge when provided with an appropriate stimulation signal (e.g., RF signals 246-249, FIG. 2). In addition, RF power amplification and distribution system 300 may include a plurality of variable attenuators 336, 337, 338, 339.

Input port 302 is coupled to an input of power splitter 310. Power splitter 310 is configured to split the power of an input RF signal 304 (e.g., amplified RF signal 142, FIG. 1) received at input port 302 into four output RF signals 322, 323, 324, 325. In the illustrated embodiment, power splitter 310 includes a first two-way splitter 312, which splits the input RF signal 304 into two intermediate RF signals 320, 321, each of which has a power level of approximately half the power level of the input signal 304. In addition, power splitter 310 includes second and third two-way splitters 313, 314, each of which is configured to receive and split one of the intermediate RF signals 320, 321 into a set of two of the output RF signals 322-325. According to an embodiment, each of the output RF signals 322-325 has a power level of approximately half the power level of the corresponding intermediate RF signal 320, 321. Accordingly, each output RF signal 322-325 may have a power level that is approximately one quarter the power level of the input RF signal 304. In an alternate embodiment, power splitter 310 may be configured to split an input signal into signals of unequal power. In addition, in other alternate embodiments, the three two-way splitters 312-314 of power splitter 310 may be implemented using Wilkinson power dividers or using a single four-way splitter. In still other alternate embodiments, power splitter 310 may be configured to split an input signal into more or fewer than four output signals.

According to an embodiment, each output of power splitter 310 is coupled to an input of a variable phase shifter 332-335. Each phase shifter 332-335 applies a phase shift to one of RF signals 322-325. According to one embodiment, referred to below as the "90 degree combiner" embodiment, the phase shifts applied by the four phase shifters 332-335 are applied so that each pair of signals input to a first set of combiners 372, 373 of the power combiner network 370 are substantially 90 degrees out of phase with each other. According to another embodiment, referred to below as the "180 degree combiner" embodiment, the phase shifts applied by the four phase shifters 332-335 are applied so that each pair of signals input to the first set of combiners 372, 373 of the power combiner network 370 are either substantially in phase with each other, or are substantially 180 degrees apart from each other. In either embodiment, the phase shifts applied by the phase shifters 332-335 are selected so that, after amplification (by amplifiers 352-355) and combining (by power combiners 372-375), a majority of the RF power will be supplied to one output port 390-393 at a time. More specifically, the phase shifts are applied so that the majority of the RF power is provided to the output port 390-393 that is coupled to whichever cylinder is performing its power stroke, according to an embodiment.

In order to supply a majority of the RF power to one output port 390-393 at a time, the phase shifts applied by variable phase shifters 332-335 are dynamically adjustable, in an embodiment. For example, the variable phase shifters 332-335 may be included in one or more modules, such as module 330. According to an embodiment, module 330 is configured to receive one or more control signals 344 (e.g., control signal 182 from control unit 130, FIG. 1), and to cause phase shifters 332-335 to apply phase shifts to RF signals 322-325 based on the control signals 344. More specifically, module 330 may include a digital input for receiving the control signal 344. The digital input may be coupled to a data interface (e.g., a serial interface such as a serial peripheral interface (SPI) or an inter integrated circuit (12C) interface, not illustrated). Logic (not illustrated) of the module 330 may determine the phase shifts to be applied by each phase shifter 332-335 based on the control signals 344, and may cause the phase shifters 332-335 to apply the determined phase shifts to the RF signals 322-325, accordingly. Phase shifting systems that are configured differently from the above described module 330 may be used in other embodiments, including systems implemented using PIN diodes, switch arrays, and so on.

In addition, in an embodiment, variable attenuators 336-339 each may attenuate one of the relatively shifted signals produced by the phase shifters 332-335. The attenuation may be applied, for example, in order to compensate for inequalities in the amplification, by amplifiers 352-355, of each phase shifted signal. The variable attenuators 336-339 may be included in the same module 330 as the variable phase shifters 332-335, and thus the attenuation levels applied by the variable attenuators 336-339 may be determined based on one or more of the control signals 344. Although the phase shifters 332-335 are shown to precede the variable attenuators 336-339, the phase shifters 332-335 and attenuators 336-339 may be reversed in order, in an alternate embodiment. In an alternate embodiment, variable attenuators 336-339 may be excluded from the system.

The phase shifters 332-335 and/or attenuators 336-339 (if included) are coupled to amplifiers 352-355, which may form portions of an amplifier module 350. Amplifiers 352-355 may be single stage amplifiers or multiple stage amplifiers, in various embodiments. Either way, each amplifier 352-355 receives one of the phase shifted (and possibly attenuated) signals 340-343, and amplifies the signals to produce a phase shifted, amplified signal 360, 361, 362, 363. According to an embodiment, the amplified signals 360-363 have power levels which, once combined by power combiner network 370, are sufficient to enable generation of a plasma discharge by radiation elements 396-399. For example, according to an embodiment, each amplifier may be capable of producing an amplified signal 360-363 having a power level in a range of about 200 Watts (W) to about 500 W. Ultimately, as will be explained in more detail later, this results in an output RF signal 384, 385, 386, 387 at one of output ports 390-393 having a power level in a range of about 800 W to about 2.0 kilowatts (kW). In other embodiments, amplifiers 352-355 may be configured to produce phase shifted, amplified signals 360-363 having larger or smaller power levels than the above-given range, and/or the power of output RF signals 384-387 may be larger or smaller than the above-given range. Desirably, each of amplifiers 352-355 provide amplification in a range of about 25 decibels (dB) to about 40 dB (e.g., about 30 dB), although amplifiers 352-355 may provide higher or lower levels of amplification, in other embodiments.

Power combiner network 370 includes a plurality of power combiners 372-375 that are configured and coupled together to produce a high power RF signal at one of output ports 390-393 at a time when provided with amplified RF signals 360-363 having appropriate phases. According to an embodiment, a first set of power combiners 372, 373 are coupled to the amplifiers 352-355, and a second set of power combiners 374, 375 are coupled to the radiating elements 396-399 via the output ports 390-393. When the impedances of the power combiners 372-375 and the radiating elements 396-399 are significantly mismatched, impedance matching elements (not illustrated) may be included between the second set of power combiners 374, 375 and the radiating elements 396-399.

In the 90 degree combiner embodiment, each power combiner 372-375 is a 90 degree combiner, such as a hybrid quadrature combiner. Accordingly, each combiner 372-375 includes a first input port (referred to commonly as an "input port"), a second input port (referred to commonly as an "isolated port"), a first output port (referred to commonly as a "transmitted port"), and a second output port (referred to commonly as a "coupled port"). Each of the first and second input ports receive input RF signals, and when the input RF signals are substantially 90 degrees out of phase with each other, the input RF signals add at one of the output ports and cancel at the other one of the output ports.

Conversely, in the 180 degree combiner embodiment, each power combiner 372-375 is a 180 degree combiner, such as a hybrid ring coupler. Similar to the 90 degree combiner embodiment, in the 180 degree combiner embodiment, each combiner 372-375 includes a first input port, a second input port, a first output port, and a second output port. Each of the first and second input ports receive input RF signals. When the input RF signals are substantially in phase with each other, the input RF signals add at a first one of the output ports (referred to commonly as the "sigma" port) and cancel at a second one of the output ports (referred to commonly as the "delta" port). Conversely, when the input RF signals are substantially 180 degrees out of phase with each other, the input RF signals add at the second one of the output ports (or the delta port) and cancel at the first one of the output ports (or the sigma port).

In the embodiment of FIG. 3, power combiner network 370 includes four power combiners 372-375, which include a first set of power combiners 372, 373 and a second set of power combiners 374, 375. A first power combiner 372 has two input ports coupled to the outputs of amplifiers 352 and 353, respectively. A second power combiner 373 has two input ports coupled to the outputs of amplifiers 354 and 355, respectively. A first output of the first power combiner 372 is coupled to a first input of a third power combiner 374, and a second output of the first power combiner 372 is coupled to a first input of a fourth power combiner 375. A first output of the second power combiner 373 is coupled to a second input of the third power combiner 374, and a second output of the second power combiner 373 is coupled to a second input of a fourth power combiner 375. The first and second outputs of the third and fourth power combiners 374 and 375 each are coupled to one of output ports 390-393.

In the 90 degree combiner embodiment, the phase shifts applied to RF signals 322-325 by phase shifters 332-335 are selected so that a first pair of the amplified RF signals 360, 361 provided to the inputs to the first power combiner 372 are about 90 degrees out of phase with each other, and so that a second pair of the amplified RF signals 362, 363 provided to the inputs to the second power combiner 373 also are about 90 degrees out of phase with each other. This causes each of the first and second power combiners 372, 373 to produce an intermediate RF signal 380, 381, 382, 383 having a relatively high power level of about twice the power level of the amplified RF signals 360-363 at one output port, while providing a signal of relatively low or negligible amplitude at the other output port. Which output port produces the relatively high power RF signal depends on which input RF signal 360-363 leads in phase and which input RF signal 360-363 lags in phase. According to an embodiment, the phase shifts are applied by phase shifters 332-335 so that either: a) intermediate RF signals 380 and 382 simultaneously have relatively high power levels that are about 90 degrees out of phase with each other and intermediate RF signals 381 and 383 have relatively low power levels; or b) intermediate RF signals 380 and 382 have relatively low power levels and intermediate RF signals 381 and 383 have relatively high power levels that are about 90 degrees out of phase with each other.

The first pair of intermediate RF signals 380, 382 is provided to the inputs of the third power combiner 374, and the second pair of intermediate RF signals 381, 383 is provided to the inputs of the fourth power combiner 375. The power combiner 374 or 375 that receives the pair of out of phase intermediate RF signals 380-383 having relatively high power levels produces an output RF signal 384-387 having an even higher power level of about twice the power level of the intermediate RF signals 380-383 (or about four times the power level of the amplified RF signals 340-343) at one output port, while providing a signal of relatively low or negligible amplitude at the other output port. Again, which output port produces the relatively high power RF signal depends on which input intermediate RF signal 380-383 leads in phase and which input intermediate RF signal 380-383 lags in phase. According to an embodiment, the phase shifts are applied by phase shifters 332-335 so that only one of output RF signals 384-387 has a relatively high power level during any given time period, and each of the other output RF signals 384-387 have relatively low or negligible power levels during that time period. For example, the output RF signal 384-387 with the relatively high power level may have a power level in the range of about 5 dB to about 15 dB (i.e., greater than 0 dB), while the output RF signals 384-387 with the relatively low power levels may have power levels in the range of about −300 dB to about −500 dB (i.e., less than −100 dB). The magnitudes and/or differences in magnitude of the relatively high and the relatively low power levels may be different from the above given ranges, in other embodiments.

In the 180 degree combiner embodiment, the phase shifts applied to RF signals 322-325 by phase shifters 332-335 are selected so that a first pair of the amplified RF signals 360, 361 provided to the inputs to the first power combiner 372 are about 180 degrees out of phase with each other, and so that a second pair of the amplified RF signals 362, 363 provided to the inputs to the second power combiner 373 also are about 180 degrees out of phase with each other. This causes each of the first and second power combiners 372, 373 to produce an intermediate RF signal 380, 381, 382, 383 having a relatively high power level of about twice the power level of the amplified RF signals 360-363 at one output port, while providing a signal of relatively low or negligible amplitude at the other output port. Which output port produces the relatively high power RF signal depends on which input RF signal 360-363 leads in phase and which input RF signal 360-363 lags in phase. According to an embodiment, the phase shifts are applied by phase shifters 332-335 so that either: a) intermediate RF signals 380 and 382 simultaneously have relatively high power levels that are about 180 degrees out of phase with each other and intermediate RF signals 381 and 383 have relatively low power levels; or b) intermediate RF signals 380 and 382 have relatively low power levels and intermediate RF signals 381 and 383 have relatively high power levels that are about 180 degrees out of phase with each other.

The first pair of intermediate RF signals 380, 382 is provided to the inputs of the third power combiner 374, and the second pair of intermediate RF signals 381, 383 is provided to the inputs of the fourth power combiner 375. The power combiner 374 or 375 that receives the pair of out of phase intermediate RF signals 380-383 having relatively high power levels produces an output RF signal 384-387 having an even higher power level of about twice the power level of the intermediate RF signals 380-383 (or about four times the power level of the amplified RF signals 340-343) at one output port, while providing a signal of relatively low or negligible amplitude at the other output port. Again, which output port produces the relatively high power RF signal depends on which input intermediate RF signal 380-383 leads in phase and which input intermediate RF signal 380-383 lags in phase. According to an embodiment, the phase shifts are applied by phase shifters 332-335 so that only one of output RF signals 384-387 has a relatively high power level during any given time period, and each of the other output RF signals 384-387 have relatively low or negligible power levels during that time period. For example, the output RF signal 384-387 with the relatively high power level may have a power level in the range of about 50 dBm to about 65 dBm, while the output RF signals 384-387 with the relatively low power levels may have power levels in the range of about 0 dBm to about 40 dBm. The magnitudes and/or differences in magnitude of the relatively high and the relatively low power levels may be different from the above given ranges, in other embodiments. Those of skill in the art would understand, based on the description herein, that in other embodiments, the intermediate RF signals 380-383 may be coupled in a different configuration to phase shifters 374, 375, and substantially the same result of steering power to one of the output RF signals 384-387 may be achieved in such a different configuration using different phase shifts.

In either the 90 degree combiner or 180 degree combiner embodiment, the output port 390-393 to which a relatively high power level RF signal 384-387 is provided corresponds to the output port to which it is desired to produce a plasma discharge by the corresponding radiation device 396-399. As was described above, the plasma discharge is produced by only one radiation device 396-399 at a time, and the timing for generation of the plasma discharge is controlled to be at or near the beginning of the power stroke for the cylinder associated with the radiation device 396-399. Referring also to FIG. 2, assume that RF signal 246 represents a signal provided to radiation device 396, RF signal 247 represents a signal provided to radiation device 397, RF signal 248 represents a signal provided to radiation device 398, and RF signal 249 represents a signal provided to radiation device 399.

Table 1, below, which corresponds to the 90 degree combiner embodiment, gives an example of phase shifts that may be applied by each of the phase shifters 332-335 in order for RF power amplification and distribution system 300 to provide a relatively high power output RF signal 384-387 to one radiation device 396-399 at a time. More specifically, each column corresponds to one of radiation devices 396-399 ("RD"), and each row corresponds to one of phase shifters 332-335 ("PS"). The phase shift values (in degrees) within each column indicate examples of phase shifts that may simultaneously be applied by each of the corresponding phase shifters 332-335 in order for the RF power amplification and distribution system 300 to provide a relatively high power output RF signal (e.g., one of output RF signals 384-387) to the radiation device 396-399 that corresponds with that column (i.e., to the radiation device 396-399 that is associated with the cylinder that is performing a power stroke).

TABLE 1

Phase Shifts during Power Stroke for Each Cylinder
(90 degree combiner embodiment)

|        | RD 396 (period 202) | RD 397 (period 201) | RD 398 (period 203) | RD 399 (period 204) |
|--------|---------------------|---------------------|---------------------|---------------------|
| PS 332 | 0                   | 0                   | 180                 | 0                   |
| PS 333 | 90                  | 90                  | 90                  | −90                 |
| PS 334 | 90                  | −90                 | −90                 | −90                 |
| PS 335 | 180                 | 0                   | 180                 | 180                 |

The combinations of phase differences represented in each column of Table 1 represent examples of pre-determined phase differences which, when they exist between the amplified, phase shifted RF signals (e.g., amplified, phase shifted RF signals 360-363, FIG. 3), cause the power combiner network (e.g., power combiner network 370, FIG. 3) to combine the amplified, phase shifted RF signals to produce one output RF signal (e.g., one of output RF signals 384-387, FIG. 3) with a relatively high power level and to produce the remaining output RF signals (e.g., the remaining three of output RF signals 384-387, FIG. 3) with relatively low power levels. It should be noted that, although specific example phase shifts have been provided in Table 1, above, and those example phase shifts are discussed below, phase shifts that vary from the specified values (e.g., by +/−15 degrees) alternatively may be used, in other embodiments. In addition, although each example phase shift value is a multiple of 90 degrees, alternate embodiments may implement phase shifts that are a multiple of 90 degrees plus or minus some offset. For example, referring to the first column of Table 1 (corresponding to period 202), the example phase shifts of 0 degrees, 90 degrees, 90 degrees, and 180 degrees may be replaced with phase shifts that include an offset of 45 degrees (i.e., phase shifts of 45 degrees, 135 degrees, 135 degrees, and 225 degrees). Of course, offsets other than 45 degrees may be used, as well, in other embodiments.

For example, as Table 1 indicates, during the power stroke for the cylinder associated with radiation device 396 (e.g., during period 202, FIG. 2), phase shifter 332 applies a 0 degree phase shift to RF signal 322, phase shifter 333 applies a 90 degree phase shift to RF signal 323, phase shifter 334 applies a −90 degree phase shift to RF signal 324, and phase shifter 335 applies a 0 degree phase shift to RF signal 325. This causes the amplified RF signals 360-363 to arrive at power combiner network 370 with phase relationships that ensure that the power combiner network 370 will combine all of the amplified RF signals 360-363 so that only output RF signal 384 has a relatively high power level, while the other three output RF signals 385-387 have relatively low or negligible power levels.

Similarly, during the power stroke for the cylinder associated with radiation device 397 (e.g., during period 201, FIG. 2), phase shifter 332 applies a 0 degree phase shift to RF signal 322, phase shifter 333 applies a 90 degree phase shift to RF signal 323, phase shifter 334 applies a 90 degree phase shift to RF signal 324, and phase shifter 335 applies a 180 degree phase shift to RF signal 325. This causes the amplified RF signals 360-363 to arrive at power combiner network 370 with phase relationships that ensure that the power combiner network 370 will combine all of the amplified RF signals 360-363 so that only output RF signal 385 has a relatively high power level, while the other three output RF signals 384, 386, and 387 have relatively low or negligible power levels.

Similarly, during the power stroke for the cylinder associated with radiation device 398 (e.g., during period 203, FIG. 2), phase shifter 332 applies a 180 degree phase shift to RF signal 322, phase shifter 333 applies a 90 degree phase shift to RF signal 323, phase shifter 334 applies a −90 degree phase shift to RF signal 324, and phase shifter 335 applies a 180 degree phase shift to RF signal 325. This causes the amplified RF signals 360-363 to arrive at power combiner network 370 with phase relationships that ensure that the power combiner network 370 will combine all of the amplified RF signals 360-363 so that only output RF signal 386 has a relatively high power level, while the other three output RF signals 384, 385, and 387 have relatively low or negligible power levels.

Finally, during the power stroke for the cylinder associated with radiation device 399 (e.g., during period 204, FIG. 2), phase shifter 332 applies a 0 degree phase shift to RF signal 322, phase shifter 333 applies a −90 degree phase shift to RF signal 323, phase shifter 334 applies a −90 degree phase shift to RF signal 324, and phase shifter 335 applies a 180 degree phase shift to RF signal 325. This causes the amplified RF signals 360-363 to arrive at power combiner network 370 with phase relationships that ensure that the power combiner network 370 will combine all of the amplified RF signals 360-363 so that only output RF signal 387 has a relatively high power level, while the other three output RF signals 384-386 have relatively low or negligible power levels.

Table 2, below, which corresponds to the 180 degree combiner embodiment, gives an example of phase shifts that may be applied by each of the phase shifters 332-335 in order for RF power amplification and distribution system 300 to provide a relatively high power output RF signal 384-387 to one radiation device 396-399 at a time. Again, each column corresponds to one of radiation devices 396-399, and each row corresponds to one of phase shifters 332-335. The phase shift values (in degrees) within each column indicate examples of phase shifts that may simultaneously be applied by each of the corresponding phase shifters 332-335 in order for the RF power amplification and distribution system 300 to provide a relatively high power output RF signal (e.g., one of output RF signals 384-387) to the radiation device 396-399 that corresponds with that column (i.e., to the radiation device 396-399 that is associated with the cylinder that is performing a power stroke).

TABLE 2

Phase Shifts during Power Stroke for Each Cylinder
(180 degree combiner embodiment)

|  | RD 396 (period 202) | RD 397 (period 201) | RD 398 (period 203) | RD 399 (period 204) |
|---|---|---|---|---|
| PS 332 | 0 | 0 | 0 | 0 |
| PS 333 | 0 | 0 | 180 | 180 |
| PS 334 | 0 | 180 | 0 | 180 |
| PS 335 | 0 | 180 | 180 | 0 |

The combinations of phase differences represented in each column of Table 2 represent examples of pre-determined phase differences which, when they exist between the amplified, phase shifted RF signals (e.g., amplified, phase shifted RF signals 360-363, FIG. 3), cause the power combiner network (e.g., power combiner network 370, FIG. 3) to combine the amplified, phase shifted RF signals to produce one output RF signal (e.g., one of output RF signals 384-387, FIG. 3) with a relatively high power level and to produce the remaining output RF signals (e.g., the remaining three of output RF signals 384-387, FIG. 3) with relatively low power levels. It should be noted that, although specific example phase shifts have been provided in Table 2, above, and those example phase shifts are discussed below, phase shifts that vary from the specified values (e.g., by +/−15 degrees) alternatively may be used, in other embodiments. In addition, although each example phase shift value is a multiple of 180 degrees, alternate embodiments may implement phase shifts that are a multiple of 180 degrees plus or minus some offset. For example, referring to the second column of Table 2 (corresponding to period 201), the example phase shifts of 0 degrees, 0 degrees, 180 degrees, and 180 degrees may be replaced with phase shifts that include an offset of 45 degrees (i.e., phase shifts of 45 degrees, 45 degrees, 225 degrees, and 225 degrees). Of course, offsets other than 45 degrees may be used, as well, in other embodiments.

For example, as Table 2 indicates, during the power stroke for the cylinder associated with radiation device 396 (e.g., during period 202, FIG. 2), phase shifter 332 applies a 0 degree phase shift to RF signal 322, phase shifter 333 applies a 0 degree phase shift to RF signal 323, phase shifter 334 applies a 0 degree phase shift to RF signal 324, and phase shifter 335 applies a 0 degree phase shift to RF signal 325. In other words, both pairs of amplified RF input signals 360, 361 and 362, 363 are substantially in phase with each other when they are input to the first set of power combiners 372, 373. This causes the amplified RF signals 360-363 to arrive at power combiner network 370 with phase relationships that ensure that the power combiner network 370 will combine all of the amplified RF signals 360-363 so that only output RF signal 384 has a relatively high power level, while the other three output RF signals 385-387 have relatively low or negligible power levels.

Similarly, during the power stroke for the cylinder associated with radiation device 397 (e.g., during period 201, FIG. 2), phase shifter 332 applies a 0 degree phase shift to RF signal 322, phase shifter 333 applies a 0 degree phase shift to RF signal 323, phase shifter 334 applies a 180 degree phase shift to RF signal 324, and phase shifter 335 applies a 180 degree phase shift to RF signal 325. In other words, both pairs of amplified RF input signals 360, 361 and 362, 363 are substantially in phase with each other when they are input to the first set of power combiners 372, 373, but the pairs are substantially 180 degrees out of phase with each other. This causes the amplified RF signals 360-363 to arrive at power combiner network 370 with phase relationships that ensure that the power combiner network 370 will combine all of the amplified RF signals 360-363 so that only output RF signal 385 has a relatively high power level, while the other three output RF signals 384, 386, and 387 have relatively low or negligible power levels.

Similarly, during the power stroke for the cylinder associated with radiation device 398 (e.g., during period 203, FIG. 2), phase shifter 332 applies a 0 degree phase shift to RF signal 322, phase shifter 333 applies a 180 degree phase shift to RF signal 323, phase shifter 334 applies a 180 degree phase shift to RF signal 324, and phase shifter 335 applies a 0 degree phase shift to RF signal 325. In other words, both pairs of amplified RF input signals 360, 361 and 362, 363 are substantially 180 degrees out of phase with each other when they are input to the first set of power combiners 372, 373. This causes the amplified RF signals 360-363 to arrive at power combiner network 370 with phase relationships that ensure that the power combiner network 370 will combine all of the amplified RF signals 360-363 so that only output RF signal 386 has a relatively high power level, while the other three output RF signals 384, 385, and 387 have relatively low or negligible power levels.

Finally, during the power stroke for the cylinder associated with radiation device 399 (e.g., during period 204, FIG. 2), phase shifter 332 applies a 0 degree phase shift to RF signal 322, phase shifter 333 applies a 180 degree phase shift to RF signal 323, phase shifter 334 applies a 180 degree phase shift to RF signal 324, and phase shifter 335 applies a 0 degree phase shift to RF signal 325. In other words, once again, both pairs of amplified RF input signals 360, 361 and 362, 363 are substantially 180 degrees out of phase with each other when they are input to the first set of power combiners 372, 373. This causes the amplified RF signals 360-363 to arrive at power combiner network 370 with phase relationships that ensure that the power combiner network 370 will combine all of the amplified RF signals 360-363 so that only output RF signal 387 has a relatively high power level, while the other three output RF signals 384-386 have relatively low or negligible power levels.

Those of skill in the art would understand, based on the description herein, that the example phase shifts given in Tables 1 and 2, above, are not meant to be limiting. As long as the phase shifts of signals input to any of power combiners 372-375 are substantially 90 degrees out of phase (for the 90 degree combiner embodiment) or the phase shifts are substantially in phase or substantially 180 degrees out of phase (for the 180 degree combiner embodiment), the power combiner network 370 will function substantially the same (i.e., providing one output RF signal 384-387 having a relatively high power level at a time). For example, the phase shifts applied by the phase shifters 332-335 need not be multiples of 90 degrees or 180 degrees. Instead, each of the phase shifts may be offset from a multiple of 90 degrees or 180 degrees. Such alternate embodiments are intended to be included within the scope of the inventive subject matter.

In addition, those of skill in the art also would understand, based on the description herein, that the illustrated and described embodiments readily may be modified to apply to systems with more or fewer than four output ports (e.g., four output ports 390-393). Accordingly, for example, embodiments of RF power amplification and distribution systems may be configured to be used in plasma ignition systems for three cylinder, six cylinder, eight cylinder, or twelve cylinder internal combustion engines. In a three cylinder embodiment, for example, one of the output ports (e.g., one of output ports 390-393) could be terminated with a 50 Ohm (or other impedance) load, rather than being coupled to a radiation device that is configured to generate a plasma discharge. In addition, in embodiments that include more than four cylinders, the RF power amplification and distribution system may be modified to include any integer, N, of phase shifting/amplification paths, and the power combiner network 370 may be modified appropriately to combine the N RF signals produced by the phase shifting/amplification paths to produce a single, relatively high power RF signal at only one of N output ports at a time. Such alternate embodiments are intended to be included within the scope of the inventive subject matter.

The various components and modules of RF power amplification and distribution system 300 may be incorporated together using various types of semiconductor technologies and at various levels of integration. For example, in a highly integrated system, the power splitter 310, phase shifters 332-335, attenuators 336-339 (and/or module 330), amplifiers 352-355, and power combiner network 370 could be integrated together in a single discrete package or in a single module that may be mounted to a printed circuit board (PCB). Alternatively, subsets of these components may be integrated together in discrete packages, and/or incorporated at the PCB level. For example, the power splitter 310 and/or power combiner network 370 could readily be incorporated at the PCB level, and the phase shifters 332-335, attenuators 336-339, and amplifiers 352-355 could be included in one or more discrete packages. Further, the phase shifters 332-335, attenuators 336-339, and amplifiers 352-355 could be implemented on any combination of silicon, gallium arsenide (GaAs), gallium nitride (GaN), or other semiconductor substrates. Alternatively, some of these components could be implemented as discrete components. According to a particular embodiment, the amplifiers 352-355 include laterally diffused metal oxide semiconductor (LDMOS) transistors, although other types of transistors could be used, as well.

Figure 4:
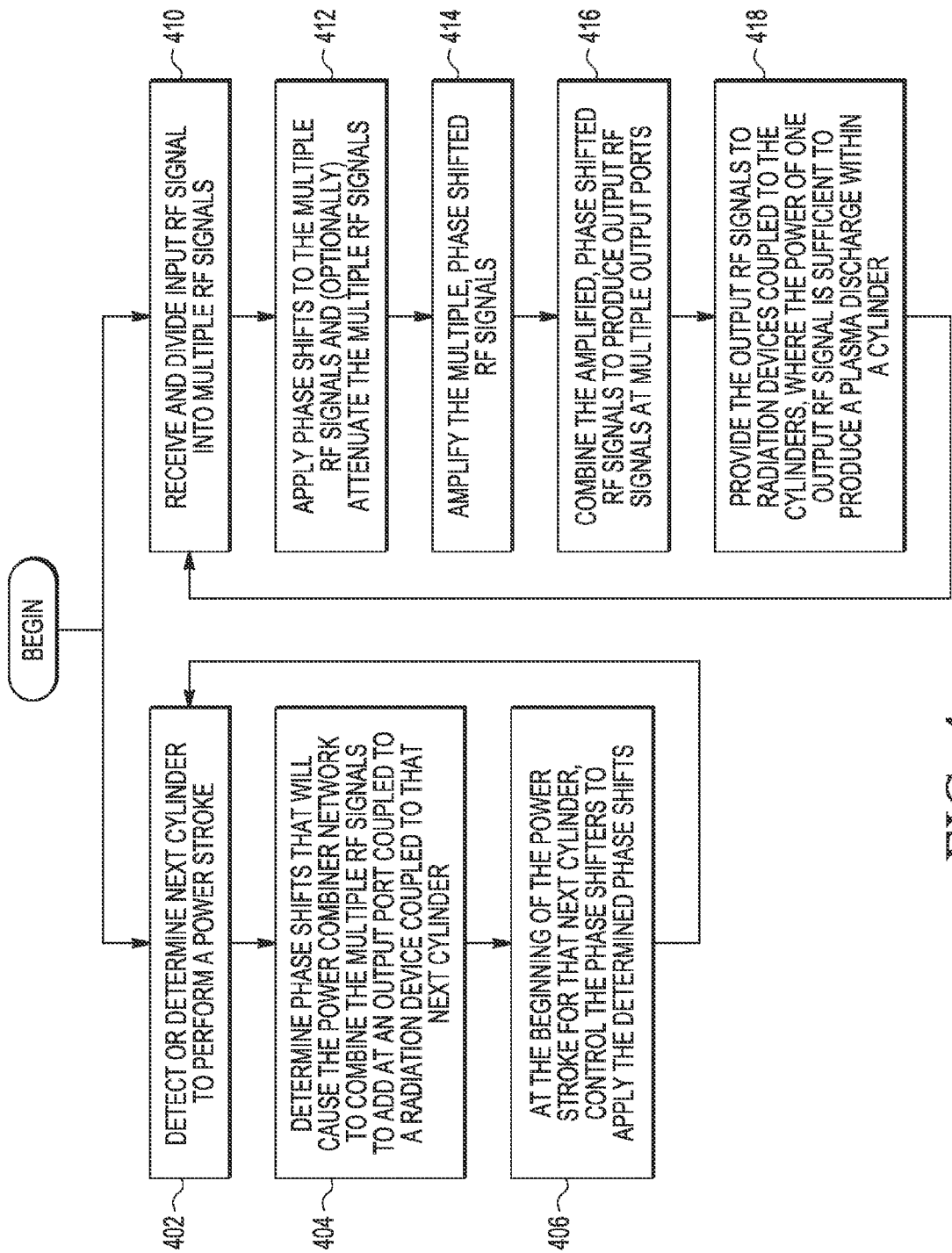
FIG. 4 is a flowchart of a method of operating a plasma ignition system that includes an RF power amplification and distribution system, in accordance with an example embodiment.

FIG. 4 is a flowchart of a method of operating a plasma ignition system (e.g., plasma ignition system 110, FIG. 1) that includes an RF power amplification and distribution system (e.g., RF power amplification and distribution system 118, 300, FIGS. 1, 3), in accordance with an example embodiment. According to an embodiment, the method includes at least two parallel processes, with a first process being reflected in blocks 402-406, and a second process being reflected in blocks 410-420. Although these processes will be discussed sequentially, it should be understood that they would be performed in parallel when the system is operating in a steady state, and that the processes also are performed repeatedly during operation of the plasma ignition system.

According to an embodiment, the first process (i.e., blocks 402-406), referred to below as a "phase shift setting process," includes determining and setting phase shifts for multiple phase shifters (e.g., phase shifters 332-335, FIG. 3) to ensure that a high power RF signal is provided to an appropriate radiation device (e.g., one of radiation devices 396-399, FIG. 3) at the beginning of the power stroke for a cylinder coupled to the radiation device. The second process (i.e., blocks 410-420), referred to below as an "RF signal amplification and distribution process," includes receiving and processing an input RF signal (e.g., RF signal 142, 304, FIGS. 1, 3), in order to distribute a high power RF signal to one output port at a time.

Referring first to block 402, the phase shift setting process includes detecting or determining a next cylinder (e.g., one of cylinders 152-155, FIG. 1) that will be performing a power stroke. This determination may be made by a control unit (e.g., control unit 130, FIG. 1), for example, which may step through a state diagram that indicates the current stroke for each cylinder, and thus the next cylinder to perform a power stroke (i.e., the cylinder that is currently performing a compression stroke). Alternatively, this determination may be made based on sensing the angular position of the crankshaft, and correlating that angular position with information indicating which cylinder will next perform a power stroke. Other methods of determining which cylinder is next to perform a power stroke also may be implemented.

In block 404, phase shifts to be applied by the system's phase shifters (e.g., phase shifters 332-335, FIG. 3) are determined (e.g., by control unit 130, FIG. 1). More specifically, phase shifts are determined that will cause the system's power combiner (e.g., power combiner network 370, FIG. 3) to combine multiple phase shifted RF signals (e.g., RF signals 360-363, FIG. 3) together so that the combined signals will add at an output port (e.g., one of output ports 390-393, FIG. 3) that is coupled to a radiation device (e.g., one of radiation devices 396-399, FIG. 3) that is coupled to the next cylinder to perform the power stroke. For example, this determination may be made by accessing phase shift values for the cylinder from a stored table of phase shifts (e.g., one of Tables 1 or 2, above, depending on whether a 90 degree or 180 degree combiner embodiment is implemented). Alternatively, the determination may be made in some other manner.

In block 406, at or before the beginning of the power stroke for the cylinder, the phase shifters (e.g., phase shifters 332-335, FIG. 3) are controlled so that they will apply the phase shifts determined in block 404 to the input RF signals (e.g., to RF signals 322-325, FIG. 3). For example, when the phase shifters form a portion of a module (e.g., module 330, FIG. 3) that facilitates digital control of the phase shifters, a control signal (e.g., control signal 182, 344, FIGS. 1, 3) may be provided to the module that indicates the phase shifts. Logic of the module may then, in turn, control each phase shifter to apply the determined phase shift. By performing blocks 402-406, the RF power amplification and distribution system may be dynamically configured to produce relatively high power RF signals to the radiation devices of each cylinder during the power stroke of each cylinder.

Referring now to block 410, the RF signal amplification and distribution process includes receiving (e.g., at input port 302, FIG. 3) and dividing (e.g., by power divider 310, FIG. 3) an input RF signal (e.g., RF signal 142, 304, FIGS. 1, 3). This results in the production of multiple RF signals (e.g., RF signals 322-325, FIG. 3), which may be of substantially equal power, in an embodiment.

In block 412, the phase shifters (e.g., phase shifters 332-335, FIG. 3) apply phase shifts to each of the multiple RF signals, where the phase shifts correspond to the phase shifts determined and established in blocks 404 and 406. Application of a 0 degree phase shift is still considered to be a phase shift, as those terms are used herein. As discussed previously, some or all of the multiple RF signals also may be attenuated (e.g., using attenuators 336-339, FIG. 3), in an embodiment. In any event, application of the phase shifts results in the production of multiple phase shifted RF signals (e.g., RF signals 340-343, FIG. 3).

In block 414, the multiple phase shifted RF signals are amplified (e.g., by amplifiers 352-355, FIG. 3), in order to produce multiple amplified, phase shifted RF signals (e.g., RF signals 360-363, FIG. 3). As discussed previously, amplification may be performed in one or multiple stages, and each of the amplifiers may provide amplification in a range of about 25 dB to about 40 dB, although the amplifiers may provide higher or lower levels of amplification, in other embodiments.

In block 416, the multiple amplified, phase shifted RF signals are provided to an RF power combiner network (e.g., RF power combiner network 370, FIG. 3). The RF power combiner network combines the amplified, phase shifted RF signals in order to produce, at multiple output ports (e.g., output ports 390-393, FIG. 3), multiple output RF signals (e.g., output RF signals 146-149, 384-387, FIGS. 1, 3). When the RF power combiner network received amplified, phase shifted RF signals having the appropriate phase relationships, the RF power combiner network produces one output RF signal having a relatively high power level (e.g., a power level sufficient to produce a plasma discharge), while the remaining output RF signals have relatively low power levels (e.g., power levels that are not sufficient to produce plasma discharges).

In block 418, the output RF signals are provided to radiation devices (e.g., radiation devices 120-123, 390-393, FIGS. 1, 3) that are coupled to the cylinders (e.g., cylinders 152-155, FIG. 1). When the power of an output RF signal is sufficiently high, the RF signal will cause the radiation device to produce a plasma discharge within the combustion chamber of the cylinder, thus initiating the power stroke for that cylinder. Conversely, when the power of an output RF signal is not sufficiently high, the radiation device that receives that RF signal will not produce a plasma discharge. Using the above-described method, the RF plasma ignition system may produce plasma discharges in each of the cylinders during each cylinder's respective power stroke by dynamically adjusting the phases of the RF signals provided to the system's RF power combiner network.

Although FIGS. 1-4 illustrates and correspond to a four cylinder engine and a plasma ignition system configured to produce a plasma discharge in each of four cylinders during a power stroke of a four stroke cycle, it should be understood that the various embodiments may be modified to apply to engines that have more or fewer than four cylinders, and also to engines that have an odd number of cylinders. More particularly, embodiments may be generalized to apply to engines that have N cylinders, where N is any reasonable integer. Accordingly, embodiments of RF amplification and distribution systems may be generalized to include a splitter that splits an input RF signal into N RF signals, N phase shifters configured to apply phase shifts to the N RF signals in order to produce N phase shifted RF signals, N amplifiers configured to amplify the N phase shifted RF signals in order to produce N amplified, phase shifted RF signals, and a power combiner that includes N input ports and N output ports, where the power combiner is configured to combine and direct the N amplified, phase shifted RF signals toward the N output ports based on phase differences between the N amplified, phase shifted RF signals.

In addition, it should be understood that the various embodiments may be used in both two-stroke engines and four-stroke engines. Further, although the various embodiments may be implemented in motor vehicles, the embodiments also may be implemented in other fossil-fuel powered systems, including generators, landscaping equipment (e.g., lawnmowers, weed trimmers, blowers), heavy equipment (e.g., tractors, cranes, and so on), trains, aircraft, and watercraft, to name a few additional examples. In addition, the various embodiments may be implemented in other types of systems in which distributed, high power RF signals are desired. For example, embodiments may be implemented in multiple antenna communication systems (e.g., multiple-input and/or multiple-output (MIMO) systems and/or broadcast systems), and/or in microwave ovens with multiple radiation elements that produce RF energy for the purpose of heating objects, to name just two examples. In some alternate embodiments, the input RF signal may be modulated using any of a number of modulation techniques that are designed to enable information to be communicated and/or that provide some other advantageous effect.

An embodiment of a system includes N amplifiers and a power combiner network. Each amplifier of the N amplifiers is configured to receive one of N phase shifted RF signals, and the N amplifiers are further configured to amplify the N phase shifted RF signals to produce N amplified, phase shifted RF signals. The power combiner network has N input ports and N output ports. Each of the N input ports is coupled to an output of one of the N amplifiers, and the power combiner network is configured to combine the N amplified, phase shifted RF signals to produce N output RF signals at the N output ports. The relative power levels of the N output RF signals are dependent upon phase differences between the N amplified, phase shifted RF signals.

An embodiment of a plasma ignition system for an internal combustion engine having up to N cylinders includes a power splitter, N phase shifters, N amplifiers, a power combiner network, and up to N radiation devices. The power splitter has an input and N outputs, and the power splitter is configured to divide an input RF signal received on the input into N divided RF signals, and to provide the N divided RF signals on the N outputs. Each of the N phase shifters has an input and an output, where each input is coupled to one of the N outputs of the power splitter, and each phase shifter is configured to receive one of the N divided RF signals and to apply one of multiple predetermined phase shifts to the N divided RF signals in order to produce N phase shifted RF signals. The N amplifiers are coupled to the N phase shifters, and the N amplifiers are configured to receive the N phase shifted RF signals, and to amplify the N phase shifted RF signals to produce N amplified, phase shifted RF signals. The power combiner network has N input ports and N output ports, where each of the N input ports is coupled to an output of one of the N amplifiers, and the power combiner network is configured to combine the N amplified, phase shifted RF signals to produce N output RF signals at the N output ports. The relative power levels of the N output RF signals are dependent upon phase differences between the N amplified, phase shifted RF signals. Each of the radiation devices is coupled to one of the N output ports of the power combiner network, and each of the radiation devices is configured to receive an output RF signal of the N output RF signals, and to produce a plasma discharge when a power level of the output RF signal is sufficiently high.

An embodiment of a method includes applying predetermined phase shifts to N input RF signals in order to produce N phase shifted RF signals, amplifying the phase shifted RF signals to produce N amplified, phase shifted RF signals, and combining the N amplified, phase shifted RF signals to produce N output RF signals at N output ports. The relative power levels of the N output RF signals are dependent upon phase differences between the N amplified, phase shifted RF signals.

According to a further embodiment, the combining process includes combining the N amplified, phase shifted RF signals using a network of 90 degree combiners, where each 90 degree combiner of the network includes first and second inputs and first and second outputs, and when each 90 degree combiner receives first and second amplified, phase shifted RF signals that are substantially 90 degrees out of phase with each other, each 90 degree combiner produces, at one of the first and second outputs, a first RF signal with a relatively high power level, and also produces, at another one of the first and second outputs, a second RF signal with a relatively low power level.

According to another further embodiment, the combining process includes combining the N amplified, phase shifted RF signals using a network of 180 degree combiners, where each 180 degree combiner of the network includes first and second inputs and first and second outputs, and when each 180 degree combiner receives first and second amplified, phase shifted RF signals that are substantially in phase with each other, each 180 degree combiner produces, at the first output, a first RF signal with a relatively high power level, and also produces, at the second output, a second RF signal with a relatively low power level, and when each 180 degree combiner receives the first and second amplified, phase shifted RF signals that are substantially 180 degrees out of phase with each other, each 180 degree combiner produces, at the second output, the first RF signal with the relatively high power level, and also produces, at the first output, the second RF signal with a relatively low power level.

According to another further embodiment, the method also includes providing the output RF signals to up to N radiation devices that are coupled to up to N cylinders of an internal combustion engine. The method may further include determining a next cylinder of the cylinders that is to perform a power stroke, determining a next set of the pre-determined phase shifts that will result in production of one output RF signal having a relatively high power level at a first one of the N output ports and production of N−1 output RF signals having relatively low power levels at a remaining N−1 output ports, and controlling N phase shifters to apply the next set of the pre-determined phase shifts to the input RF signals during the applying step.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A system comprising:
   N amplifiers, wherein N is greater than one, and wherein each amplifier of the N amplifiers is configured to receive one of N phase shifted radio frequency (RF) signals, and the N amplifiers are further configured to amplify the N phase shifted RF signals to produce N amplified, phase shifted RF signals;
   a power combiner network having N input ports and N output ports, wherein each of the N input ports is coupled to an output of one of the N amplifiers, and wherein the power combiner network is configured to combine the N amplified, phase shifted RF signals to produce N output RF signals at the N output ports, wherein relative power levels of the N output RF signals are dependent upon phase differences between the N amplified, phase shifted RF signals, and wherein the power combiner network is configured to produce, at any given time, one output RF signal having a relatively high power level at one of the N output ports and to produce N−1 output RF signals having relatively low power levels at a remaining N−1 output ports; and
   up to N radiation devices coupled to the N output ports of the power combiner network, wherein each of the radiation devices is coupled to one of up to N cylinders of an internal combustion engine, and wherein each of the radiation devices is configured to receive an output RF signal of the N output RF signals, and each of the radiation devices is configured to produce a plasma discharge in the cylinder to which the radiation device is coupled when the radiation device receives an output RF signal with the relatively high power level.

2. The system of claim 1, further comprising:
   N phase shifters coupled to inputs of the N amplifiers, wherein each phase shifter is configured to receive one of N input RF signals, and the N phase shifters are further configured to apply pre-determined phase shifts to the N input RF signals in order to produce the N phase shifted RF signals.

3. The system of claim 1, wherein the power combiner network is configured, when one of multiple sets of pre-determined phase differences exists between the N amplified, phase shifted RF signals, to combine the N amplified, phase shifted RF signals to produce the one output RF signal having the relatively high power level at the one of the N output ports and to produce the N−1 output RF signals having the relatively low power levels at the remaining N−1 output ports.

4. The system of claim 1, wherein the relatively high power level is greater than 40 dBm, and the relatively low power levels are less than 40 dBm.

5. The system of claim 1, wherein N equals four, the amplifiers produce first, second third, and fourth amplified, phase shifted signals, and the power combiner network comprises:
- first, second, third, and fourth input ports configured to receive the first, second, third, and fourth amplified, phase shifted signals, respectively;
- first, second, third, and fourth output ports configured to output first, second, third, and fourth output RF signals, respectively;
- a first combiner having first and second inputs and first and second outputs, wherein the first and second inputs are coupled to the first and second input ports, and wherein the first combiner is configured to combine the first and second amplified, phase shifted RF signals to produce first and second intermediate RF signals at the first and second outputs;
- a second combiner having third and fourth inputs and third and fourth outputs, wherein the third and fourth inputs are coupled to the third and fourth input ports, and wherein the second combiner is configured to combine the third and fourth amplified, phase shifted RF signals to produce third and fourth intermediate RF signals at the third and fourth outputs;
- a third combiner having fifth and sixth inputs and fifth and sixth outputs, wherein the fifth input is coupled to the first output of the first combiner, and the sixth input is coupled to the third output of the second combiner, wherein the third combiner is configured to combine the first and third intermediate RF signals to produce the first and second output RF signals at the fifth and sixth outputs, and wherein the fifth and sixth outputs are coupled to the first and second output ports, respectively; and
- a fourth combiner having seventh and eighth inputs and seventh and eighth outputs, wherein the seventh input is coupled to the second output of the first combiner, and the eighth input is coupled to the fourth output of the second combiner, wherein the fourth combiner is configured to combine the second and fourth intermediate RF signals to produce the third and fourth output RF signals at the seventh and eighth outputs, and wherein the seventh and eighth outputs are coupled to the third and fourth output ports, respectively.

6. The system of claim 5, wherein the first, second, third, and fourth combiners are 90 degree combiners.

7. The system of claim 5, wherein the first, second, third, and fourth combiners are 180 degree combiners.

8. The system of claim 1, further comprising:
- a power splitter having an input and N outputs, wherein the power splitter is configured to divide an input RF signal received on the input into N divided RF signals, and to provide the N divided RF signals on the N outputs; and
- N phase shifters coupled between the N outputs of the power splitter and N inputs of the N amplifiers, wherein each phase shifter is configured to receive one of the N divided RF signals, and the N phase shifters are further configured to apply pre-determined phase shifts to the N divided RF signals in order to produce the N phase shifted RF signals.

9. The system of claim 1, further comprising:
- a module that includes an interface and N phase shifters coupled to inputs of the N amplifiers, wherein each phase shifter is configured to receive one of N input RF signals, and the N phase shifters are further configured to apply pre-determined phase shifts to the N input RF signals in order to produce the N phase shifted RF signals;
- the internal combustion engine; and
- a control unit configured to send a control signal to the interface of the module, wherein the control signal causes the pre-determined phase shifts to be changed in a pre-determined sequence that results in production of the plasma discharge in each cylinder during a power stroke of the cylinder.

10. A plasma ignition system for an internal combustion engine having up to N cylinders, the plasma ignition system comprising:
- a power splitter having an input and N outputs, wherein the power splitter is configured to divide an input radio frequency (RF) signal received on the input into N divided RF signals, and to provide the N divided RF signals on the N outputs;
- N phase shifters, each having an input and an output, wherein each input is coupled to one of the N outputs of the power splitter, and wherein each phase shifter is configured to receive one of the N divided RF signals and to apply one of multiple pre-determined phase shifts to the N divided RF signals in order to produce N phase shifted RF signals;
- N amplifiers coupled to the N phase shifters, wherein the N amplifiers are configured to receive the N phase shifted RF signals, and the N amplifiers are further configured to amplify the N phase shifted RF signals to produce N amplified, phase shifted RF signals;
- a power combiner network having N input ports and N output ports, wherein each of the N input ports is coupled to an output of one of the N amplifiers, and wherein the power combiner network is configured to combine the N amplified, phase shifted RF signals to produce N output RF signals at the N output ports, wherein relative power levels of the N output RF signals are dependent upon phase differences between the N amplified, phase shifted RF signals; and
- up to N radiation devices, wherein each of the radiation devices is coupled to one of the N output ports of the power combiner network, wherein each of the radiation devices is configured to receive an output RF signal of the N output RF signals, and wherein each of the radiation devices is configured to produce a plasma discharge when a power level of the output RF signal is sufficiently high.

11. The plasma ignition system of claim 10, further comprising:
- an RF signal generator configured to produce an RF signal that includes periodic pulses of RF power; and
- a pre-amplifier coupled between the RF signal generator and the power splitter, wherein the pre-amplifier is configured to amplify the RF signal from the RF signal generator in order to produce the input RF signal.

12. The plasma ignition system of claim 10, further comprising:
- a control unit configured to cause the multiple pre-determined phase shifts to be changed in a pre-determined sequence that results in production of the plasma discharge by each of the radiation devices.

13. A method comprising:
- applying pre-determined phase shifts to N input radio frequency (RF) signals in order to produce N phase shifted RF signals, wherein N is greater than one;

amplifying the phase shifted RF signals to produce N amplified, phase shifted RF signals;

combining the N amplified, phase shifted RF signals to produce N output RF signals at N output ports, wherein relative power levels of the N output RF signals are dependent upon phase differences between the N amplified, phase shifted RF signals, and wherein, at any given time, only one output RF signal is produced with a relatively high power level at one of the N output ports, and N−1 output RF signals are produced with a relatively low power level at a remaining N−1 output ports;

providing the output RF signals to up to N radiation devices that are coupled to up to N cylinders of an internal combustion engine; and producing, by each of the radiation devices, a plasma discharge in the cylinder to which the radiation device is coupled when the radiation device receives an output RF signal with the relatively high power level.

14. The method of claim 13, wherein combining comprises:

combining the N amplified, phase shifted RF signals using a network of 90 degree combiners, wherein each 90 degree combiner of the network includes first and second inputs and first and second outputs, and when each 90 degree combiner receives first and second amplified, phase shifted RF signals that are substantially 90 degrees out of phase with each other, each 90 degree combiner produces, at one of the first and second outputs, a first RF signal with the relatively high power level, and also produces, at another one of the first and second outputs, a second RF signal with the relatively low power level.

15. The method of claim 13, wherein combining comprises:

combining the N amplified, phase shifted RF signals using a network of 180 degree combiners, wherein each 180 degree combiner of the network includes first and second inputs and first and second outputs, and when each 180 degree combiner receives first and second amplified, phase shifted RF signals that are substantially in phase with each other, each 180 degree combiner produces, at the first output, a first RF signal with the relatively high power level, and also produces, at the second output, a second RF signal with the relatively low power level, and when each 180 degree combiner receives the first and second amplified, phase shifted RF signals that are substantially 180 degrees out of phase with each other, each 180 degree combiner produces, at the second output, the first RF signal with the relatively high power level, and also produces, at the first output, the second RF signal with the relatively low power level.

16. The method of claim 13, further comprising:

determining a next cylinder of the cylinders that is to perform a power stroke;

determining a next set of the pre-determined phase shifts that will result in production of the one output RF signal having the relatively high power level and production of the N−1 output RF signals having the relatively low power level; and controlling N phase shifters to apply the next set of the pre-determined phase shifts to the input RF signals during the applying step.

17. The method of claim 13, wherein controlling comprises:

sending a control signal to a module that includes the phase shifters, wherein the control signal indicates the next set of the pre-determined phase shifts; and adjusting the phase shifters based on the control signal.

18. The method of claim 13, further comprising:

dividing a first RF signal into the N input RF signals.

* * * * *